(12) United States Patent
Holbery et al.

(10) Patent No.: US 11,219,124 B2
(45) Date of Patent: Jan. 4, 2022

(54) CONNECTING A FLEXIBLE CIRCUIT TO OTHER STRUCTURES

(71) Applicant: Microsoft Technology Licensing, LLC, Redmond, WA (US)

(72) Inventors: James David Holbery, Bellevue, WA (US); Siyuan Ma, Redmond, WA (US); Michael David Dickey, Redmond, WA (US); Andrew L. Fassler, Pittsburgh, PA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 42 days.

(21) Appl. No.: 16/381,708

(22) Filed: Apr. 11, 2019

(65) Prior Publication Data

US 2019/0239351 A1 Aug. 1, 2019

Related U.S. Application Data

(62) Division of application No. 15/287,563, filed on Oct. 6, 2016, now Pat. No. 10,327,332.

(51) Int. Cl.
| | | |
|---|---|---|
| *H05K 1/03* | (2006.01) | |
| *H05K 1/02* | (2006.01) | |
| *H05K 3/28* | (2006.01) | |
| *C08K 3/08* | (2006.01) | |
| *C08K 7/00* | (2006.01) | |
| *C09D 5/24* | (2006.01) | |
| *C09D 183/04* | (2006.01) | |
| *G06F 1/16* | (2006.01) | |
| *H01L 23/538* | (2006.01) | |
| *H05K 1/09* | (2006.01) | |
| *H05K 3/00* | (2006.01) | |
| *H05K 1/14* | (2006.01) | |

(52) U.S. Cl.
CPC ............. *H05K 1/0393* (2013.01); *C08K 3/08* (2013.01); *C08K 7/00* (2013.01); *C09D 5/24* (2013.01); *C09D 183/04* (2013.01); *G06F 1/1669* (2013.01); *H01L 23/5386* (2013.01); *H01L 23/5387* (2013.01); *H05K 1/028* (2013.01); *H05K 1/0313* (2013.01); *H05K 1/09* (2013.01); *H05K 3/0014* (2013.01); *H05K 3/285* (2013.01); *C08K 2003/0806* (2013.01); *C08K 2201/001* (2013.01); *C08K 2201/011* (2013.01); *H05K 1/148* (2013.01); *H05K 2201/026* (2013.01); *H05K 2201/0245* (2013.01); *H05K 2201/0391* (2013.01); *H05K 2203/0776* (2013.01)

(58) Field of Classification Search
CPC ...... H05K 1/0393; H05K 1/028; H05K 3/285; H05K 1/0313; H05K 1/09; H05K 3/0014; H05K 2203/0776; H05K 2201/0245; H05K 1/148; H05K 2201/026; H05K 2201/0391; H05K 2003/0806; G06F 1/1669; C09D 183/04; C09D 5/24; H01L 23/5386; H01L 23/5387; C08K 7/00; C08K 3/08; C08K 2003/0806; C08K 2201/001; C08K 2201/011; C08K 2201/026

USPC ................................. 428/353, 323, 327, 328
See application file for complete search history.

(56) References Cited

U.S. PATENT DOCUMENTS

| | | | | |
|---|---|---|---|---|
| 2,998,558 A | * | 8/1961 | Maiden | H01L 21/56 257/794 |
| 5,463,190 A | * | 10/1995 | Carson | H01R 4/04 174/256 |
| 5,664,953 A | * | 9/1997 | Reylek | H01R 25/14 439/111 |
| 5,759,737 A | * | 6/1998 | Feilchenfeld | G03F 7/0035 430/311 |
| 6,517,934 B1 | * | 2/2003 | Kishimoto | C22C 1/0441 148/100 |
| 6,819,004 B2 | * | 11/2004 | Kirsten | H01L 21/563 257/788 |
| 7,118,393 B1 | * | 10/2006 | Pupkiewicz | H01R 13/2414 439/91 |
| 8,247,525 B2 | * | 8/2012 | Schubert | C08G 65/336 528/403 |
| 9,872,390 B1 | * | 1/2018 | Holbery | H01L 21/486 |
| 10,327,332 B2 | * | 6/2019 | Holbery | C09D 5/24 |
| 2002/0142163 A1 | * | 10/2002 | Mino | B82Y 40/00 428/403 |
| 2003/0176599 A1 | * | 9/2003 | Kirsten | C08G 59/18 525/523 |
| 2003/0187116 A1 | * | 10/2003 | Misra | H01L 23/3733 524/404 |

(Continued)

FOREIGN PATENT DOCUMENTS

WO     WO2010087912 A1 * 8/2010 ........... G01N 33/354

OTHER PUBLICATIONS

Wu, Jing, et al., "One-step surface modification for irreversible bonding of various plastics with a poly(dimethylsiloxane) elastomer at room temperature", Lab Chip, 2014,14, 1564-1571. (Year: 2014).*

(Continued)

*Primary Examiner* — Douglas J McGinty
(74) *Attorney, Agent, or Firm* — Alleman Hall Creasman & Tuttle LLP (57) ABSTRACT

One example provides a circuit structure comprising a liquid metal conductive path enclosed in an encapsulant, a polymer circuit support comprising a polymer having a functional species available for a condensation reaction, and a cross-linking agent covalently bonding the encapsulant to the polymer circuit support via the functional species.

5 Claims, 6 Drawing Sheets

(56) References Cited

U.S. PATENT DOCUMENTS

| | | | |
|---|---|---|---|
| 2003/0193794 A1* | 10/2003 | Reis | H05K 9/003 |
| | | | 361/816 |
| 2004/0072025 A1* | 4/2004 | Kishimoto | G11B 5/716 |
| | | | 428/842.3 |
| 2010/0330338 A1* | 12/2010 | Boyce | B29C 59/02 |
| | | | 428/156 |
| 2014/0085837 A1* | 3/2014 | Hong | H01B 1/22 |
| | | | 361/751 |
| 2016/0037623 A1* | 2/2016 | Fjelstad | H01L 24/20 |
| | | | 361/720 |
| 2016/0108240 A1* | 4/2016 | Kashiwagi | C08L 83/00 |
| | | | 525/478 |
| 2016/0128182 A1* | 5/2016 | Park | B32B 3/08 |
| | | | 174/254 |

OTHER PUBLICATIONS

"First Office Action and Search Report Issued in Chinese Patent Application No. 201780062270.7", dated Dec. 29, 2020, 10 Pages.

* cited by examiner

CONNECTING A FLEXIBLE CIRCUIT TO OTHER STRUCTURES

CROSS REFERENCE TO RELATED APPLICATIONS

This application is a divisional of U.S. patent application Ser. No. 15/287,563, filed Oct. 6, 2016, the entire contents of which is hereby incorporated herein by reference for all purposes.

BACKGROUND

Flexible electrical interconnects may be used to connect electronic components located in portions of a device that are moveable relative to one another. In such a device, a flexible interconnect may be subject to a large number of flexing cycles over a lifetime of the device, and thus may be susceptible to damage.

SUMMARY

One example provides a circuit structure comprising a liquid metal conductive path enclosed in an encapsulant, a polymer circuit support comprising a polymer having a functional species available for a condensation reaction, and a cross-linking agent covalently bonding the encapsulant to the polymer circuit support via the functional species.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Electrical interconnects may be incorporated into a variety of devices to provide electrical pathways between device components. Some electronic devices may include joints, hinges, and/or other moveable structures that connect two parts each having electronic components. In such structures, a flexible interconnect may be utilized to bridge the components to allow the components to remain electrically interconnected as the components are moved relative to one another.

Flexible interconnects are commonly formed from solid metal traces, such as copper, patterned on a flexible substrate, such as a polyimide film. However, the solid metal traces may fatigue over time after repeated flexing, which may lead to breakage of the traces, thereby disrupting the electrical connection between the components. Even solid metal traces that are able to withstand a high number of flex cycles may fail due to pinch points, strain, twist, and/or other modes of deformation.

To address such problems, circuit elements including liquid metal conductors embedded in elastomeric encapsulant materials may be used to form electrical pathways between the components. Deformation of the circuit elements may cause changes in impedance (e.g., resistance, capacitance, and inductance) which may be measured, enabling such a circuit to also have sensing capabilities. Some such circuits also may have the advantage of being stretchable, which may help to mitigate any mechanical stress on the stretchable circuit during such flexing. This may help to resist circuit breakage from repeated flexing and/or other modes of deformation of the circuit compared to interconnects that use only solid metal traces, even when repeatedly bent to high angles (e.g. approximately 180 degrees in either direction) or deformed with a high and/or concentrated level of force, as the ability for the liquid metal to flow imparts self-healing characteristics to such an interconnect.

In another example, a stretchable/flexible circuit may comprise a conductive composite formed from elastomeric polymer embedded with conductive particulate material (carbon, silver nanowire, etc.) forming a percolating and conducting network, rather than the use of liquid metal. The conductive composite may also allow for flexing and stretching.

However, connecting such a flexible circuit element to other circuit elements, such as circuit boards, may pose challenges. For example, use of a pressure-sensitive adhesive (PSA) may create a relatively weak connection that is prone to delamination over time. It also may be challenging to form electrical connections through an elastomeric encapsulant between the liquid metal conductor and the circuit element. For example, if pins (e.g. integrated circuit pins) or wires are extended through an encapsulant that encloses the liquid metal, the pins or wires may serve as a point of weakness, potentially allowing liquid metal conductor to escape.

Accordingly, examples are disclosed that relate to covalently bonding and electrically connecting a flexible circuit element to another circuit element, such as a circuit board. In some examples, the flexible circuit element also may be stretchable. The covalent bonds between the flexible circuit element and other circuit element may allow flexing, bending, pulling, etc. of the flexible circuit element to occur while maintaining a robust mechanical connection to the other circuit element. While described below in terms of a stretchable circuit element, it will be understood that the disclosed examples also may be used with non-stretchable circuit elements (e.g. a circuit element comprising an encapsulating layer formed over a non-stretchable flexible material).

A stretchable circuit comprising an encapsulant may be joined to another circuit element comprising a polymer circuit support structure (e.g. a polyimide or other polymer film) that includes one or more functional species, such as hydroxyl, thiol, carbonyl, or other suitable group, available for a condensation reaction with a cross-linking agent. To mediate the condensation reaction, activation of the functional species at bonding surfaces via a plasma or other treatment may be performed. Further, in some examples, electrically conductive paths between the encapsulated liquid metal conductor of the stretchable circuit and the other circuit element may be provided by materials embedded in the encapsulant (e.g., carbon molecules, silver nanowires, magnetically-aligned conductive particles, carbon nano tubes, graphite, graphene flakes, silver particles, or silver flakes). The liquid metal itself may also be able to act as a via to connect to the polymer circuit support structure, given a proper seal at the interface. In such a case, embedded materials may be dispensed with.

Figure 1A:
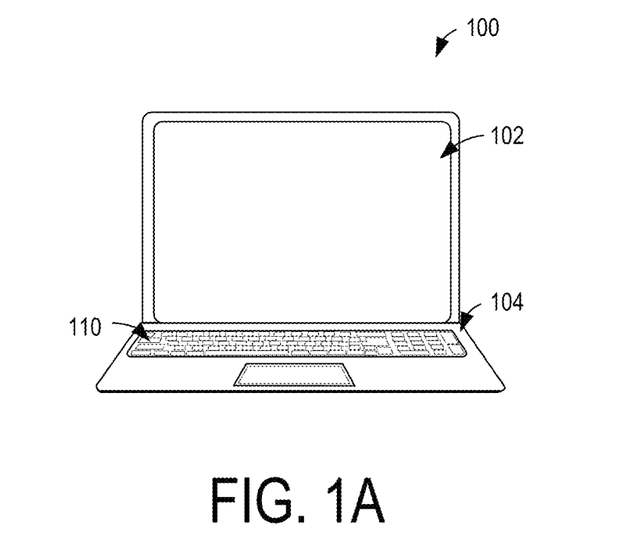
FIG. 1A shows a front view of an example computing system.
Figure 1B:
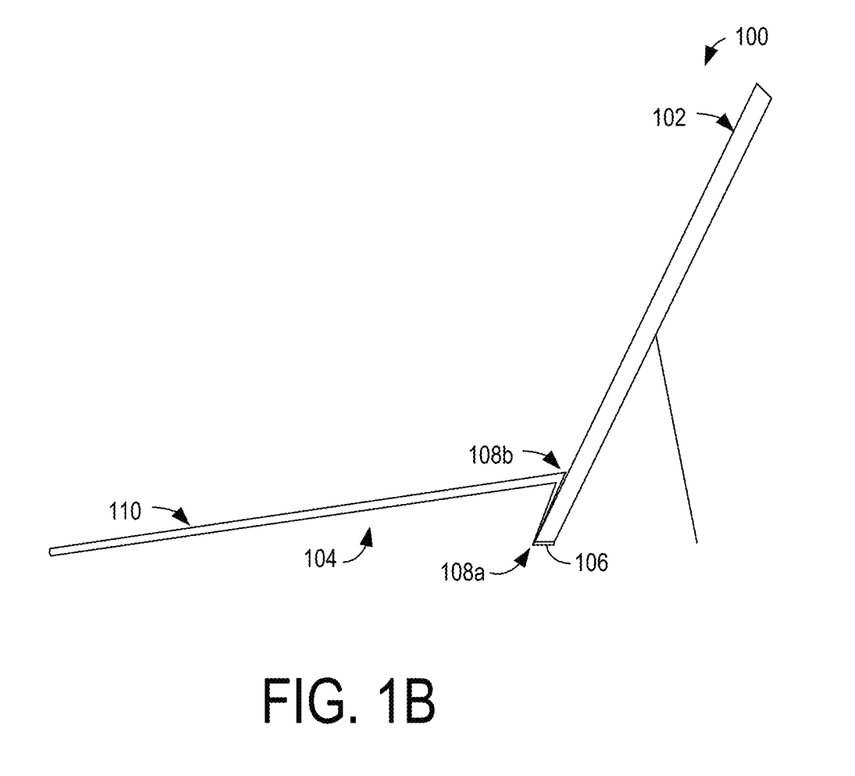
FIG. 1B shows a side view of the example computing system of FIG. 1A.
Figure 1C:
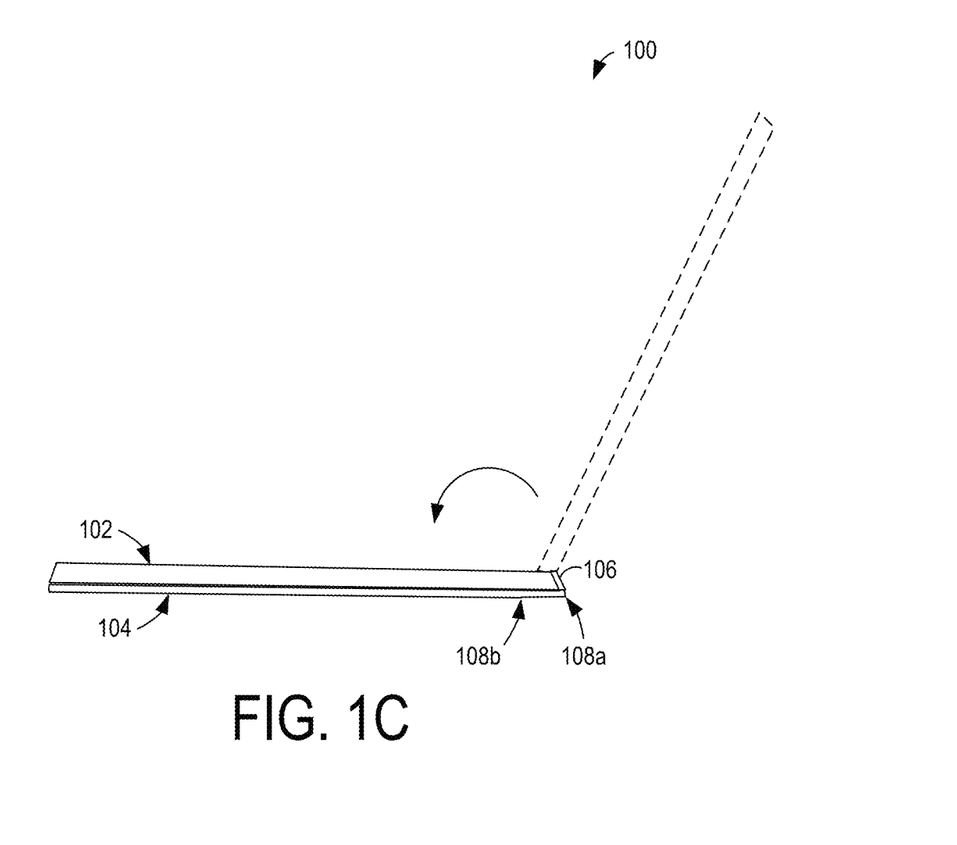
FIG. 1C shows a side view of the example computing system of FIG. 1A in a closed state.

FIGS. 1A-1C show an example computing system 100 that may include a stretchable circuit, wherein the device takes the form of a tablet having a display 102. The computing system is connected to a detachable keyboard unit 104 via a connector 106. The keyboard unit 104 comprises a flexible interconnect that electrically connects keys 110 and other electrical components of the keyboard unit 104 to the computing system 100 via the connector 106.

The keyboard unit 104 and the flexible interconnect positioned therein bend around a bottom corner of the display to a front of the display 102 in a first flex region 108a. As illustrated, the bend in this region is relatively sharp, conforming closely to the corner of the computing system 100. The keyboard unit 104 continues up the front surface of the display, and bends sharply down and away from the front surface of the display in a second flex region 108b. The bend in this region is also relatively sharp. FIG. 1C shows flex region 108b in a straightened configuration when the computing device 100 and keyboard unit 104 are in a "closed" position, as opposed to an "open" position shown in FIGS. 1A-1B. Flex region 108a also may be straightened in a similar manner, for example, when the keyboard unit 104 is removed from the computing device. In other examples, an electronic device that utilizes a flexible interconnect may take any other suitable form.

As the keyboard unit potentially may be moved between the "open" and "closed" positions, as well as other possible positions, multiple times a day for potentially years of use, the flex regions 108a-b may flex a very large number of cycles during the device lifetime. Thus, the use of a stretchable interconnect having a liquid metal may help prevent loss of conductivity due to stress-induced damage.

Figure 2:
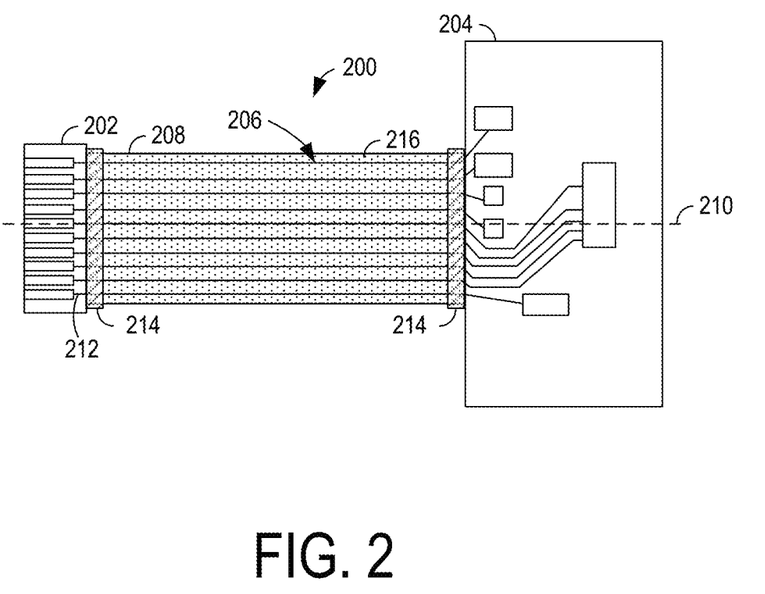
FIG. 2 shows a schematic view of an example stretchable interconnect extending between two electrical components.

FIG. 2 shows an example stretchable circuit element, in the form of stretchable interconnect 200 that may be utilized to provide signal paths in a portion of a device configured to provide a movable or flexible joint, such as the flex regions described above for computing device 100. Similar structures may be used as electrical circuit elements in other stretchable environments, such as in clothing, upholstery, medical devices, etc.

The interconnect 200 includes a plurality of conductive pathways 206 and a substrate 208, and extends between a first electrical component 202 in the form of a connector and a second electrical component 204 in the form of a circuit board having various electronic elements. In other examples, components 202 and 204 may take any other suitable form, such as an integrated circuit. A longitudinal axis 210 is shown for reference.

The conductive pathways 206 comprise a liquid metal conductor supported by the substrate 208. Liquid metal can flow to fill the shape of a channel that holds the liquid metal, and therefore is not subject to the fatigue and breakage issues of solid metal traces when repeatedly bent. In various examples, the liquid metal may be used in place of a solid conductor, or (where the circuit is flexible but not stretchable) may be used in addition to the solid conductor to provide self-healing capabilities for a solid metal trace when the solid metal trace breaks. As used herein, liquid metals may be defined as pure metals or metal alloys with a sufficiently low melting point (Tm) to be in a liquid state at room temperature. Non-limiting examples include eutectic gallium/indium (eGaIn), other gallium/indium alloys, eutectic gallium/indium/tin (Galinstan), and other gallium alloys. Solid conductors may be defined as electrical conductors having a Tm that is sufficiently above room temperature (e.g., higher than the Tm of liquid metals/conductors), such that the solid metal/conductor is solid at room temperature and at ordinary device operating temperatures. In other examples, the conductive paths may be formed from an elastomeric polymer embedded with conductive particulate material (carbon, silver nanowire, etc.) rather than or in addition to the liquid metal.

The first electrical component 202 and the second electrical component 204 include one or interfaces (e.g., contact 212) for coupling to the conductive pathways of the interconnect 200. In order to provide an electrical path between the electrical components and the conductive pathways 206 of the interconnect, an encapsulant 214 comprising electrical paths between the conductive pathways and an exterior surface of the interconnect optionally may be formed over at least a portion of the liquid metal conductive pathways 206. In various examples, the electrical paths may comprise magnetically aligned conductive particles, silver nanowires, and/or composite material (e.g., carbon molecules mixed with the polymer of the encapsulant). In the illustrated example, the encapsulant 214 is positioned at terminal regions of the conductive pathways, such that a middle region of the conductive pathways is not encapsulated by the encapsulant 214 with electrical paths, but instead by an encapsulant 216 without such paths. In other examples, the encapsulant 214 comprising the electrical paths may be formed over the full length of the conductive pathways.

In various instances, such as with aligned magnetic particles, the electrical paths between the conductive pathways and the exterior surface may be anisotropically conductive, in that they conduct electricity along a direction of the particle alignment but not in other directions. Such structures may allow electrical connections to be formed between different interconnect lines and corresponding circuit element connectors without having to pattern the encapsulant material. In other examples that do not use an anisotropic conductive material, the conductive portions of the encapsulant may be patterned to avoid forming undesired electrical connections.

Figure 3:
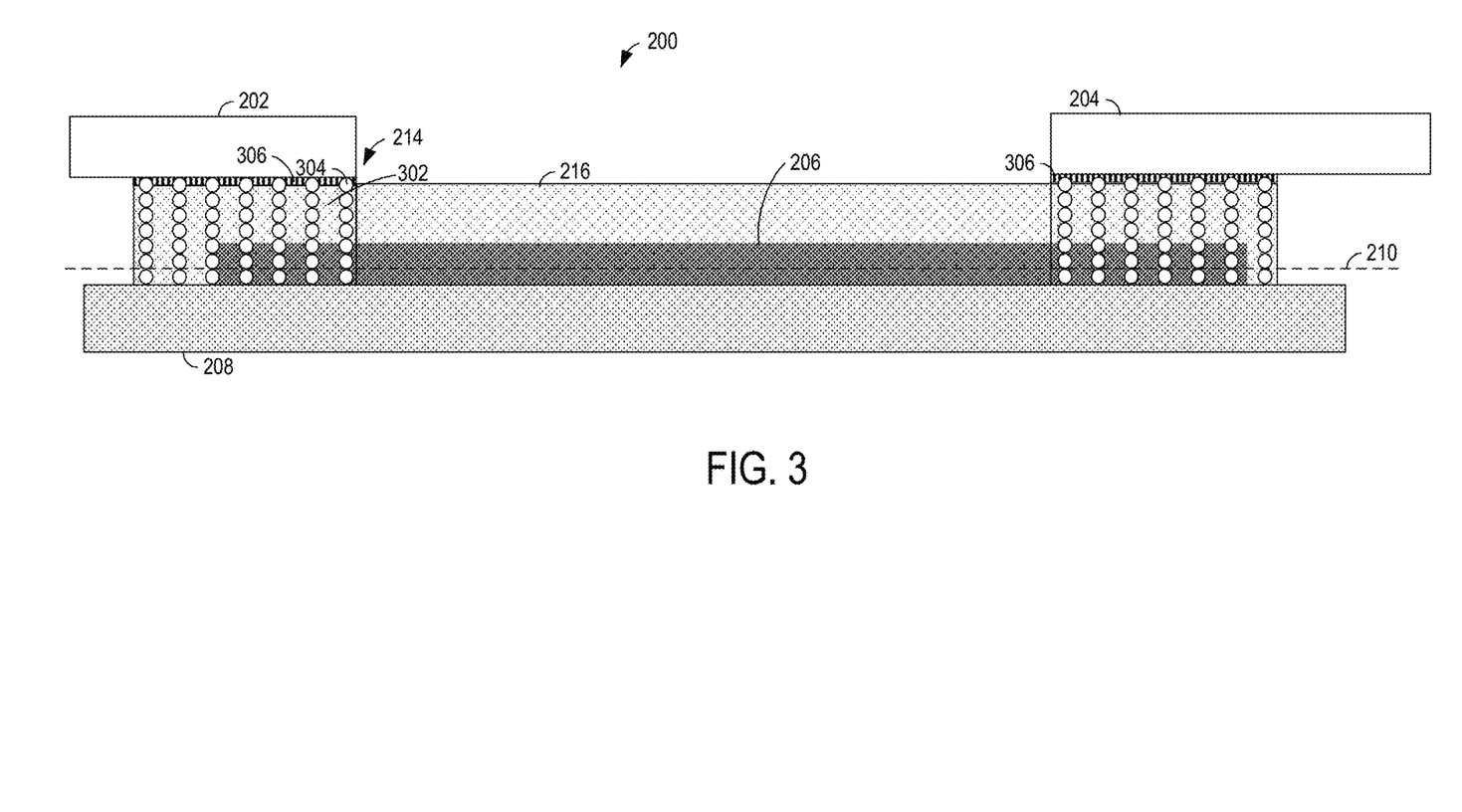
FIG. 3 shows a cross-sectional schematic view of an example stretchable interconnect.

FIG. 3 shows a sectional view of a portion of stretchable interconnect 200 of FIG. 2. The substrate 208 may be formed at least partially from any suitable electrically insulating, flexible material, such as silicone polymers. In other examples, the substrate may be formed from a flexible, but not stretchable, material. In the depicted example, the liquid metal conductor 206 is in contact with the substrate 208. In examples where a non-stretchable substrate is used, a solid metal conductive trace layer may be located between the liquid metal conductor 206 and the substrate 208.

Any suitable liquid metal may be used as liquid metal conductor 206, including the liquid metal materials described above. The liquid metal 206 may be deposited in any desired manner. For example, an alloy of gallium may be deposited via a needle orifice or the like directly onto the substrate. The outer surface of such an alloy, when exposed to air, forms a thin oxide layer that prevents the liquid metal from spreading, and thus retains the shape in which the liquid metal is initially deposited. In other examples, the encapsulating layer 216 may first be applied over the substrate 208, then a channel formed between the substrate 208 and the encapsulating layer 216, and then the liquid metal introduced into the channel (e.g. by injection or pressure differentials). Other example methods of depositing the liquid metal include electrochemically depositing the liquid metal from a bath, or spreading the liquid metal onto the solid metal trace, where selective wetting between the liquid metal and the substrate may constrain the shape of the liquid metal.

The encapsulating layer 216 helps to retain the liquid metal layer in a desired location, and electrically insulates the conductive pathways. In some examples, the encapsulating layer 216 may be formed at least partially from a siloxane-based polymer. For example, the siloxane-based polymer may comprise a siloxane-based polymer, such as silicon rubber, or the siloxane-based polymer may include an elastomer, such as polyurethane or polyacrylic, with silicon-based fillers such as silica. The encapsulating layer 216 contacts the substrate 208 in regions between conductive pathways 206. The encapsulating layer 216 may be deposited in any suitable manner, depending upon the polymer used. For example, a silicone polymer may be deposited in a fluid state, and then hardened. Where the encapsulating layer is added prior to liquid metal inclusion, a channel may be formed at the interface of the substrate and the encapsulating layer after formation of the encapsulating layer, and the liquid metal then may be added to the channel. In other examples, materials other than siloxane-based polymers may be used.

In the example shown in FIG. 3, the encapsulant 214 in the terminal regions includes electrically conductive particles that are magnetically aligned to exhibit anisotropic conductivity. The conductively anisotropic, magnetic particle-embedded encapsulant 214 is formed from a siloxane-based polymer (e.g. a silicone polymer) 302 that is embedded with magnetic particles 304. The particles are first aligned via a magnetic field, and then the siloxane-based polymer his hardened to trap the particles in the aligned state. The magnetic particles 304 may include a core of ferromagnetic material (e.g. nickel or iron) or paramagnetic material coated with an electrical conductor (e.g., copper, gold, silver, and/or other conductive material(s)). In other examples, the encapsulant 214 may comprise silver nanowires, and/or a conductor such as carbon black.

The flexible and/or stretchable circuit structure formed by liquid metal conductive pathways 206, encapsulant 216, and electrical path-containing terminal encapsulant 214 is coupled to one or more circuit elements when used in a device. Examples of such circuit elements are illustrated in FIG. 2 as first electrical component 202 and the second electrical component 204. During device use, the coupling between the stretchable circuit structure and electrical components may be flexed, bent, twisted, compressed, stretched, etc. Over time, the coupling(s) between the stretchable circuit structure and other circuit structure(s) may be prone to degradation. Thus, in order to form a robust mechanical connection and reliable electrical connection between the stretchable circuit structure and the other electrical components, a covalently-bonded interface 306 between the electrical components and the stretchable circuit structure is formed. The interface 306 comprises a cross-linking agent bonded both to the siloxane-based encapsulant of the stretchable circuit structure and a polymer surface of the other circuit element (e.g., the polymer substrate of the circuit board) that forms covalent bonds to each of these structures.

Figure 4:
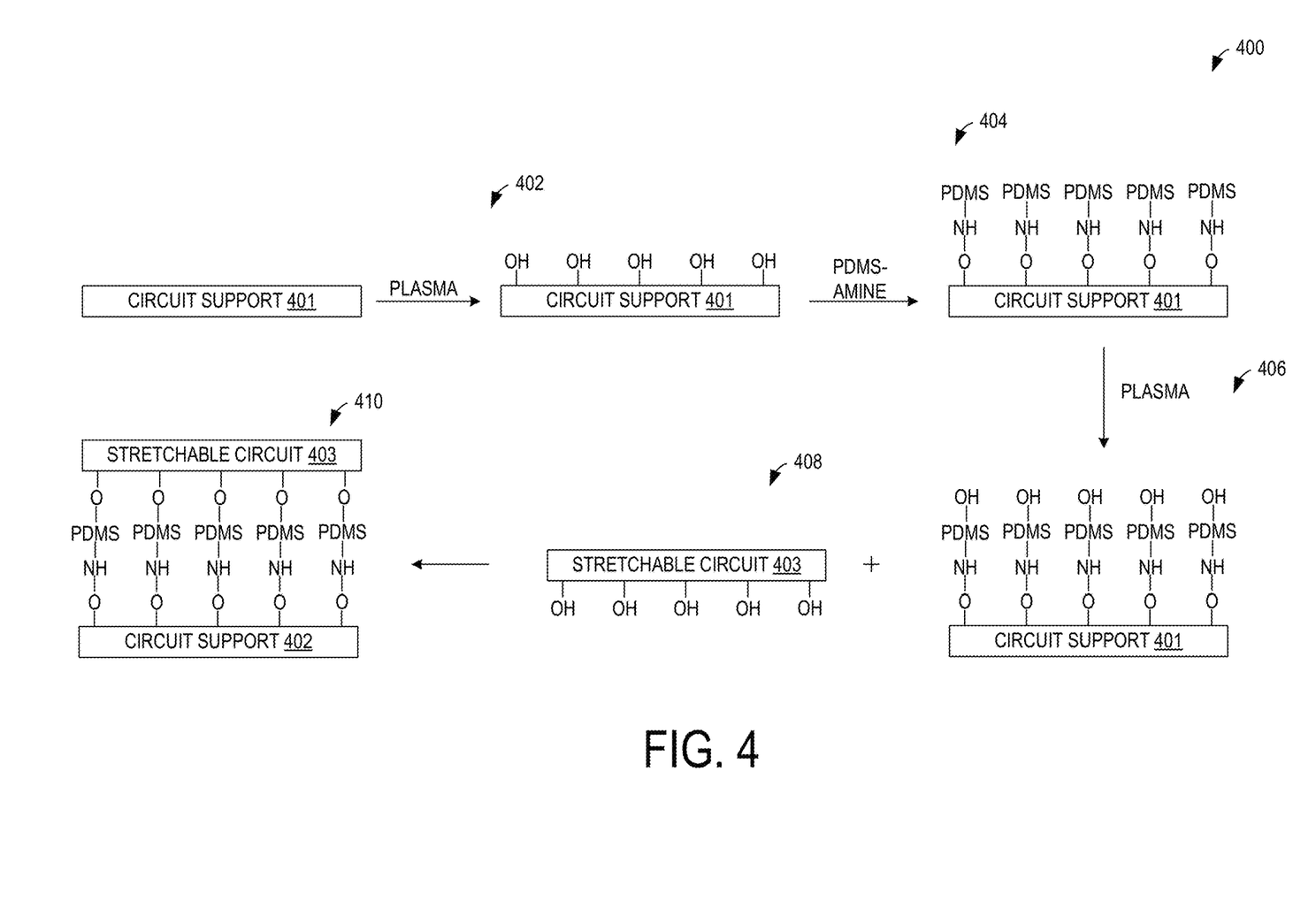
FIG. 4 shows an example process for covalently bonding a stretchable interconnect to an electrical component.

FIG. 4 shows an example process 400 for covalently bonding a siloxane-containing circuit structure to another circuit structure. Process 400 may be carried out, for example, to bond the stretchable circuit structure of FIGS. 2 and 3 to one or more other electrical components, such as the first electrical component 202 and second electrical component 204. In the depicted example, process 400 involves bonding of a polymer circuit support to a siloxane-containing encapsulant of a stretchable circuit structure via a cross-linking molecule that includes a siloxane functional group and an amine functional group; however, other functional groups may be used in other implementations. Likewise, in other examples, a non-stretchable circuit (e.g. a flexible circuit) structure comprising a siloxane outer surface, such as a polyimide circuit comprising a solid metal/liquid metal trace covered by a siloxane-based encapsulant may be bonded to another circuit structure following method 400.

At 402, process 400 comprises activating a surface of a polymer circuit support 401 of an electrical component to which the stretchable circuit structure is to be bonded. The polymer circuit support 401 may comprise any suitable polymer material, including a polyimide, polycarbonate, polyethylene terephthalate, and/or polyvinyl chloride. In some examples, the polymer circuit support may comprise a core material (e.g. a fiber material, such as fiber board) coated with another polymer material, such as one or more of those listed above. Activating the surface of the polymer circuit support 401 may include exposing the polymer circuit support 401 to a plasma, such as an oxygen plasma, air plasma, or argon plasma. Other types of activation also may be used, such as exposing the polymer circuit support to a corona discharge.

At 404, a layer of a cross-linking agent is applied to the activated surface of the polymer circuit support 401. In one example, the cross-linking agent may comprise poly[dimethyl siloxane-co-(3-aminopropyl)methyl siloxane] (PDMS-amine). In other examples, other cross-linking agents that include a siloxane functional group and an amine functional group may be used, such as cross-linking agents that include a different side group (e.g., another alkyl group, such as polydiethylsiloxane, or an aryl group such as polydiphenylsiloxane). Further, some examples may utilize cross-linking agents having a non-amine functional group for bonding to the polymer circuit element, such as a carboxyl, benzo phenol, sulfide, or phosphide group. When the cross-linking agent is applied, the activated surface of the polymer circuit support forms a covalent linkage, in this example a urethane bond, with the amine functional group of the cross-linking agent.

At 406, the cross-linking agent covalently bonded to the polymer circuit support 401 is activated via the plasma treatment (e.g., oxygen, air, and/or argon plasma), exposure to corona discharge, or other suitable mechanism to oxidize the siloxane-containing functional group of the cross-linking agent. Likewise, at 408, a stretchable circuit structure 403 is activated via plasma, corona, or other suitable treatment. In some examples, the stretchable circuit structure comprises a siloxane-based encapsulant. Examples of suitable siloxane-based materials include, but are not limited to, polymethylvinylsiloxane, polymethylphenylsiloxane, polyhydrogenmethylsiloxane, and polysilsesquioxanes.

At 410, the activated stretchable circuit structure is bonded to the activated cross-linking agent on the polymer circuit support 401. The bonding may include pressing or otherwise bringing the activated surfaces into contact, and also may involve a thermal treatment (e.g., heating the structure for a suitable duration of time, such as for an hour). As a result, a covalent linkage (in this example, a siloxane Si—O—Si bond) is formed between the cross-linking agent and the siloxane encapsulant.

In examples where the encapsulant of the stretchable circuit structure does not include silicone (e.g., a polyurethane or polyacrylic elastomer), the cross-linker may be applied to both the circuit support surface and the encapsulant surface and the siloxane covalent bond may occur between the functional groups of the cross-linking agent.

Figure 5:
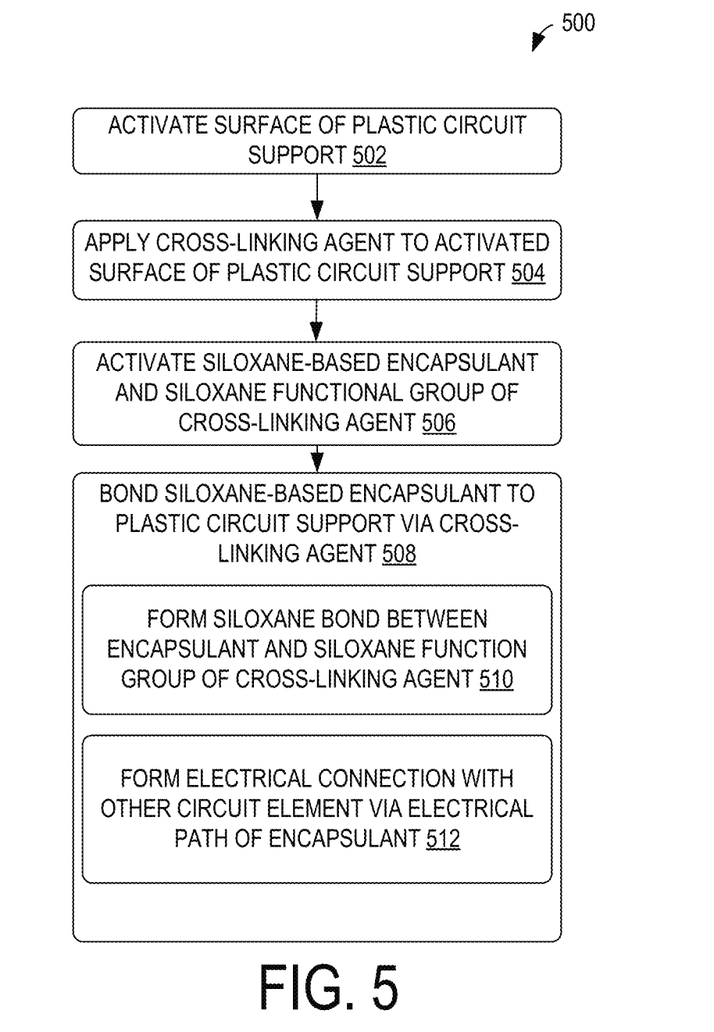
FIG. 5 shows a flow diagram depicting an example method for connecting a stretchable circuit element to another circuit element.

FIG. 5 shows a flow chart illustrating an example method 500 for covalently bonding a circuit element having a siloxane-based encapsulant, such as a stretchable siloxane-based circuit structure, to another circuit element comprising a polymer circuit support. As described above, the circuit element may comprise electrically conductive paths between a liquid metal conductor in the circuit structure and an exterior of the siloxane-based encapsulant to form connections to the other circuit elements.

At 502, method 500 includes activating a surface of the polymer circuit support. The polymer circuit support may take the form of a substrate, such as a printed circuit board, that supports various circuit elements. The polymer circuit support may be formed from any suitable material, including polyimide, polycarbonate, polyethylene terephthalate, polyvinyl chloride, or other suitable polymer material. The activation may include application of a plasma, corona discharge, or other suitable treatment.

At 504, a cross-linking agent is applied to the activated surface of the polymer circuit support. The cross-linking agent may include a first functional group comprising a siloxane moiety such as polydimethylsiloxane, polydiethylsiloxane, and/or polydiphenylsiloxane, and a second functional group configured to create a linkage with the activated surface of the polymer circuit support, such as an amine, sulfide, or phosphide group. In one example, the cross-linking agent includes poly[dimethyl siloxane-co-(3-aminopropyl)methyl siloxane], also referred to as PDMS-amine. The application of the cross-linking agent to the polymer circuit support results in the formation of a covalent bond between the amine functional group and the polymer circuit support.

At 506, a surface of the siloxane-based encapsulant of the stretchable circuit structure is activated along with the siloxane functional group of the cross-linking agent (now bonded to the polymer circuit support) via exposure to a plasma, corona discharge, and/or any other suitable treatment.

At 508, the activated siloxane-based encapsulant is bonded to the polymer circuit support, thereby covalently bonding the stretchable circuit element to the polymer circuit support. As indicated at 510, this may include forming a siloxane bond between the activated siloxane of the encapsulant and the activated siloxane functional group of the cross-linking agent. This process also may cause, at 512, formation of an electrical coupling between a circuit element of the polymer circuit support and the liquid metal conductor via the electrical path within the encapsulant. For example, when the activated siloxane-based encapsulant is brought into contact with circuit elements on the polymer circuit support during the bonding process, the previously described electrical path(s) within the encapsulant (such as nanowires, magnetically aligned particles, etc.) may contact corresponding circuit element(s) on the polymer circuit support to form the electrical coupling. In other examples, a conductor may be inserted through the encapsulant to reach the liquid metal material, and then the interface between the conductor and the encapsulant may be sealed.

Another example provides a device comprising a circuit structure comprising a conductive path enclosed in a siloxane-based encapsulant, a polymer circuit support, and a cross-linking agent covalently bonding the siloxane-based encapsulant to the polymer circuit support, the cross-linking agent comprising a siloxane functional group covalently linked to the siloxane-based encapsulant and a second functional group covalently linked to the siloxane functional group and the polymer circuit support. The conductive path may additionally or alternatively comprise one or more of liquid metal and a polymer embedded with conductive particulate material, the siloxane functional group may additionally or alternatively comprise one or more of polydimethylsiloxane, polydiethylsiloxane, and polydiphenylsiloxane, and the second functional group may additionally or alternatively comprise one or more of an amine, a sulfide, and a phosphide. The polymer circuit support may additionally or alternatively comprise one or more of polycarbonate, polyethylene terephthalate, polyvinyl chloride, and polyimide. The device may additionally or alternatively comprise an electrical coupling between the conductive path of the circuit structure and a circuit element on the polymer circuit support. The electrical coupling may additionally or alternatively comprise aligned magnetic particles embedded in the siloxane-based encapsulant. The electrical coupling may additionally or alternatively comprise one or more of silver nanowires, silver particles, and silver flakes. The electrical coupling may additionally or alternatively comprise carbon molecules embedded in the siloxane-based encapsulant. Any or all of the above-described examples may be combined in any suitable manner in various implementations.

Another example provides a method of manufacturing a device comprising encapsulating a liquid metal conductor in a siloxane-based encapsulant to form a conductive path of a flexible circuit structure, activating a surface of a polymer circuit support, applying a cross-linking agent to the surface of the polymer circuit support after activating the surface, the cross-linking agent comprising a siloxane functional group and a second functional group bound to the siloxane functional group, the second functional group covalently bonding to the activated surface of the polymer circuit support, activating the siloxane functional group of the cross-linking agent, and covalently bonding the siloxane-based encapsulant to the activated siloxane functional group of the cross-linking agent. Activating the surface of the polymer circuit support may additionally or alternatively comprise exposing the surface of the polymer circuit support to one or more of an oxygen plasma, an air plasma, and an argon plasma, and activating the siloxane functional group of the cross-linking agent additionally or alternatively comprises exposing the siloxane functional group of the cross-linking agent to one or more of oxygen plasma, air plasma, and argon plasma. The method may additionally or alternatively comprise prior to bonding the siloxane-based encapsulant to the activated siloxane functional group of the cross-linking agent, activating the siloxane-based encapsulant by exposing the siloxane-based encapsulant to one or more of an oxygen plasma, an air plasma, and an argon plasma. The method may additionally or alternatively comprise forming an electrical coupling between the liquid metal conductor of the flexible circuit structure and a circuit element of the polymer circuit support. The method may additionally or alternatively comprise at least a portion of the siloxane-based encapsulant including embedded magnetic particles. The method may additionally or alternatively comprise at least a portion of the siloxane-based encapsulant comprising embedded nanowires. Activating the surface of the polymer circuit support may additionally or alternatively comprise activating a surface of a polycarbonate, a polyethylene terephthalate, a polyvinyl chloride, or a polyimide circuit support. Applying the cross-linking agent to the surface of the polymer circuit support may additionally or alternatively comprise applying poly[dimethylsiloxane-co-(3-aminopropyl)methylsiloxane]. Any or all of the above-described examples may be combined in any suitable manner in various implementations.

Another example provides for a device comprising a first circuit element on a first polymer circuit support, a second circuit element on a second polymer circuit support, an interconnect between the first circuit element and the second circuit element, the interconnect comprising, a liquid conductive pathway encapsulated in a siloxane-based encapsulant, and an electrical path that interfaces with the liquid conductive pathway between the liquid conductive pathway and one or more of the first circuit element and the second circuit element, the electrical path extending through the siloxane-based encapsulant, and a cross-linking agent covalently bonding the siloxane-based encapsulant to the first circuit support and the second circuit support, the cross-linking agent comprising a siloxane functional group bound to the siloxane-based encapsulant and a second functional group bound to the siloxane functional group and the first polymer circuit support and second polymer circuit support. The siloxane functional group may additionally or alternatively comprise one or more of polydimethylsiloxane, polydiethylsiloxane, and polydiphenylsiloxane. The second function group may additionally or alternatively comprise one or more of an amine, a carboxyl, a benzo phenol, a sulfide, and a phosphide. The first polymer circuit support and second polymer circuit support each may additionally or alternatively comprise one or more of polycarbonate, polyethylene terephthalate, polyvinyl chloride, and polyimide. The electrical path may additionally or alternatively comprise one or more of aligned magnetic particles, silver nanowires, carbon nano tubes, graphite, graphene flakes, silver particles, silver flakes, and carbon molecules embedded in the siloxane-based encapsulant. Any or all of the above-described examples may be combined in any suitable manner in various implementations.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A device comprising:
a first circuit element on a first polymer circuit support;
a second circuit element on a second polymer circuit support;
an interconnect between the first circuit element and the second circuit element, the interconnect comprising
a liquid conductive pathway encapsulated in a siloxane-based encapsulant, and
an electrical path that interfaces with the liquid conductive pathway between the liquid conductive pathway and one or more of the first circuit element and the second circuit element, the electrical path extending through the siloxane-based encapsulant; and
a cross-linking agent covalently bonding the siloxane-based encapsulant to the first circuit support and the second circuit support, the cross-linking agent comprising a siloxane functional group bound to the siloxane-based encapsulant and a second functional group bound to the siloxane functional group and the first polymer circuit support and second polymer circuit support.

2. The device of claim 1, wherein the siloxane functional group comprises one or more of polydimethylsiloxane, polydiethylsiloxane, and polydiphenylsiloxane.

3. The device of claim 1, wherein the second functional group comprises an amine.

4. The device of claim 1, wherein the first polymer circuit support and second polymer circuit support each comprise polyimide.

5. The device of claim 1, wherein the electrical path comprises aligned magnetic particles.

* * * * *